(12) United States Patent
Kato

(10) Patent No.: US 7,682,964 B2
(45) Date of Patent: Mar. 23, 2010

(54) METHOD OF FORMING A CONTACT HOLE IN A SEMICONDUCTOR DEVICE

(75) Inventor: Kazusuke Kato, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 366 days.

(21) Appl. No.: 11/229,685

(22) Filed: Sep. 20, 2005

(65) Prior Publication Data

US 2006/0049446 A1 Mar. 9, 2006

Related U.S. Application Data

(62) Division of application No. 09/793,395, filed on Feb. 27, 2001, now Pat. No. 6,987,296.

(30) Foreign Application Priority Data

Feb. 29, 2000 (JP) .............................. 2000-058007

(51) Int. Cl.
*H01L 21/4763* (2006.01)
(52) U.S. Cl. ............... 438/637; 438/622; 257/E21.577; 257/E21.585
(58) Field of Classification Search ................. 438/622, 438/637; 257/E21.577, 585
See application file for complete search history.

(56) References Cited

U.S. PATENT DOCUMENTS

| | | | |
|---|---|---|---|
| 4,523,372 A * | 6/1985 | Balda et al. .................. | 438/623 |
| 5,300,814 A | 4/1994 | Matsumoto et al. | |
| 5,360,994 A | 11/1994 | Wolters et al. | |
| 5,410,183 A | 4/1995 | Murai | |
| 5,518,961 A | 5/1996 | Ishimaru | |
| 5,689,126 A | 11/1997 | Takaishi | |
| 5,804,479 A | 9/1998 | Aoki et al. | |
| 6,107,182 A * | 8/2000 | Asahina et al. ............. | 438/618 |
| 6,121,684 A | 9/2000 | Liaw | |
| 6,194,304 B1 * | 2/2001 | Morozumi et al. .......... | 438/618 |
| 6,225,698 B1 | 5/2001 | Tang | |
| 6,245,661 B1 * | 6/2001 | Matsumoto et al. ......... | 438/622 |
| 2001/0024873 A1 * | 9/2001 | Rohr et al. .................. | 438/625 |

FOREIGN PATENT DOCUMENTS

| | | |
|---|---|---|
| JP | 02-187031 | 7/1990 |
| JP | 05-335422 | 12/1993 |
| JP | 07-297190 | 11/1995 |
| JP | 8-23033 | 1/1996 |
| JP | 9-107082 | 4/1997 |
| JP | 11-274434 | 10/1999 |

* cited by examiner

*Primary Examiner*—Matthew C Landau
*Assistant Examiner*—Daniel Luke
(74) *Attorney, Agent, or Firm*—Volentine & White, P.L.L.C.

(57) ABSTRACT

A semiconductor device includes a semiconductor substrate, a lower conductive layer formed over the semiconductor substrate, an intermediate insulating layer formed over the lower conductive layer and an upper conductive layer formed over the intermediate insulating layer. The upper conductive layer crosses the lower conductive layer. The semiconductor device also includes a contact hole formed at a crossing portion of the lower conductive layer and the upper conductive layer. The contact hole is formed in the intermediate insulating layer. An aspect ratio of the contact hole is greater than 0.6.

4 Claims, 13 Drawing Sheets

MEMORY CELL

PERIPHERAL

MEMORY CELL

PERIPHERAL

MEMORY CELL

PERIPHERAL

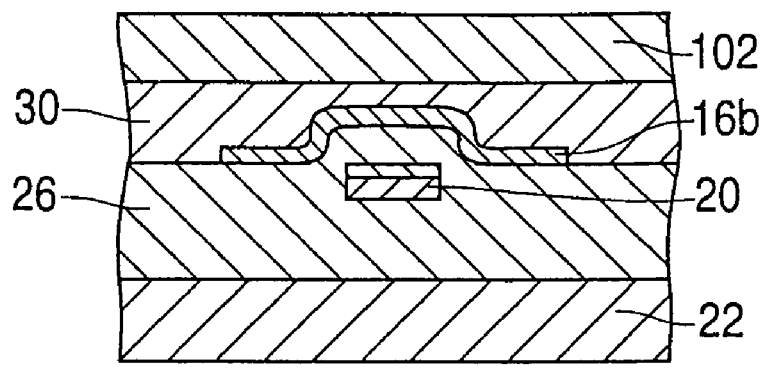
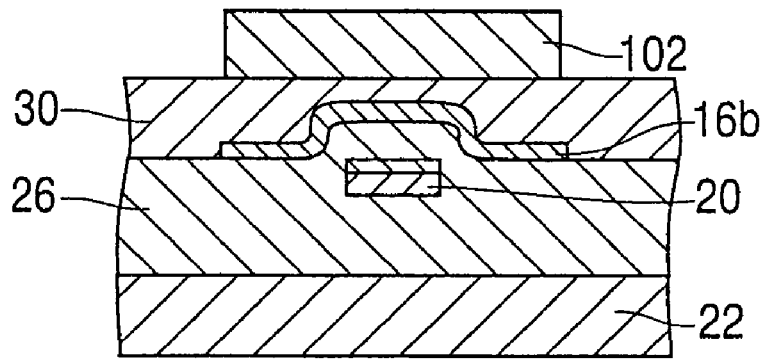
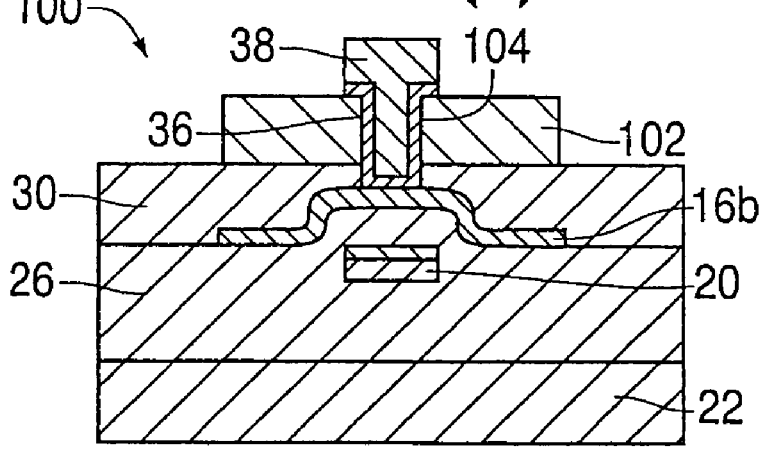

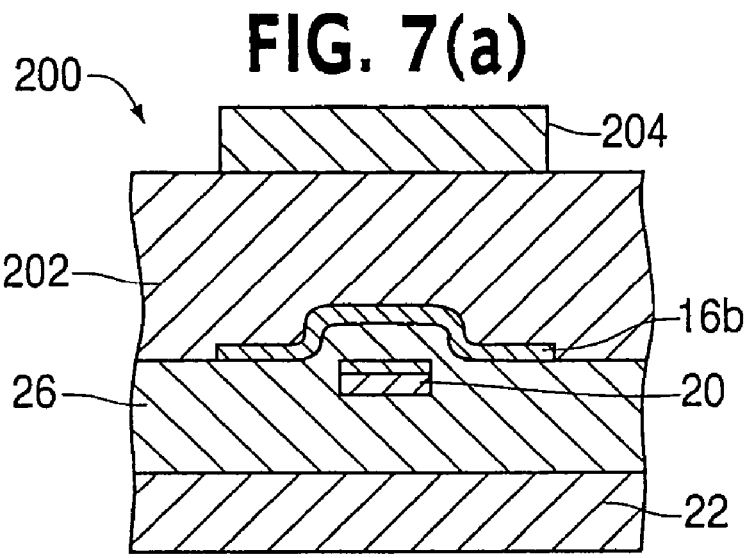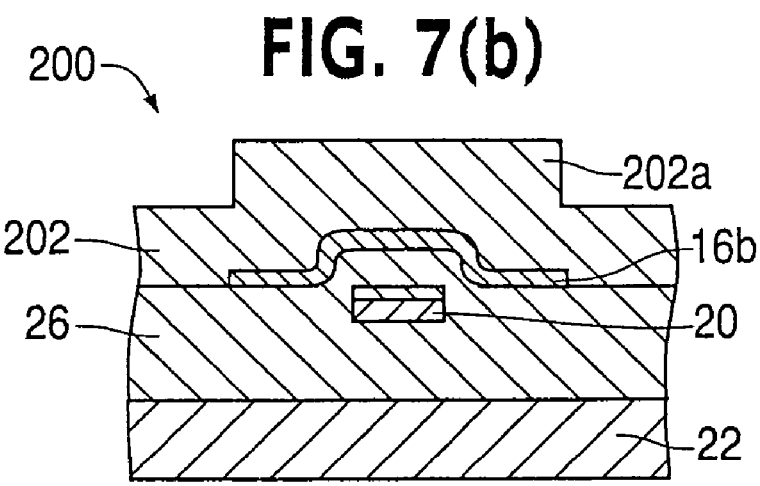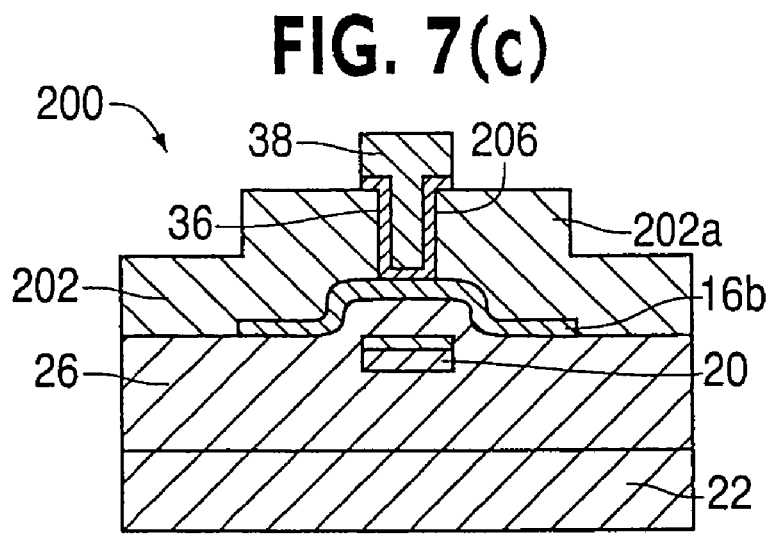

BEFORE RTN

AFTER RTN

METHOD OF FORMING A CONTACT HOLE IN A SEMICONDUCTOR DEVICE

CROSS REFERENCE TO RELATED APPLICATIONS

This is a divisional application of application Ser. No. 09/193,395, filed Feb. 27, 2001, now U.S. Pat. No. 6,987,296, which is hereby incorporated by reference in its entirety for all purposes.

BACKGROUND OF THE INVENTION

1. Field of the Invention

The present invention relates to a semiconductor device, and to a method for manufacturing the same. In particular, the present invention relates to a Dynamic Random Access Memory (DRAM) semiconductor device that has a Capacitor Over Bitline (COB) structure.

2. Description of the Related Art

DRAMs are used as conventional memory devices for computers, printers, etc. A Capacitor Over Bitline (COB) structure is commonly used to achieve miniaturization of such DRAM circuits. In the COB structure, a capacitor of a memory cell is formed over a bit line to thereby reduce an area of the memory cell.

In the semiconductor device having a COB structure, a conductive layer which forms a capacitor electrode is also used to form a resistance of a peripheral circuit. FIG. 12(a) is a cross sectional view of a memory cell 10 of a conventional semiconductor device, and FIG. 12(b) is a cross sectional view of the peripheral circuit. The semiconductor device has a capacitor 16, which includes a lower electrode 16a, an upper electrode 16b, and a capacitor insulating layer 16c, as shown in FIG. 12(a). The semiconductor device further has a first conductive layer 18, a second conductive layer 20, a third conductive layer (not shown in FIG. 12), a first intermediate insulating layer 26, a second intermediate insulating layer 30, a barrier metal layer 36, and an interconnection layer 38 as shown in FIGS. 12(a) and 12(b). A fourth conductive deposition layer 16b, which is made of a polysilicon, forms the upper electrode 16b of the capacitor 16, as well as resistance in the peripheral circuit. While the upper electrode 16b and the resistance are not connected, they are formed by the same deposition process and are thus contained in the same deposition layer.

The interconnection layer 38 is electrically connected to the resistance of the fourth conductive layer 16b via a contact hole 34 located at the peripheral circuit. A top surface of the second intermediate insulating layer 30 at the contact hole is flattened, as shown in FIG. 12(b). The thickness of this portion of the second intermediate insulating layer 30, where the interconnection 38 is connected, is thinner than other portions thereof due to an uneven surface of the first intermediate insulating layer 26. That is, a convex portion is caused in the first intermediate insulating layer 26 due to the second conductive layer 20.

If an aspect ratio of the contact hole 34 becomes smaller, a problem arises as described below with respect to FIGS. 13(a) and 13(b).

A barrier metal layer 36, which is a titanium nitride (TiN) in this example, is formed over the contact hole 34, as shown in FIG. 13(b). A metal layer (Ti layer) 36a is formed over the resistance (fourth conductive layer 16b) and the second intermediate insulating layer 30 as shown FIG. 13(a). Then, a Rapid Thermal Nitridation (RTN) is performed. The surface barrier metal layer (Ti layer) is nitrided during the RTN. However, some titanium silicide is formed at a connecting portion between the barrier metal layer (Ti) and the polysilicon of the fourth conductive layer 16b. About 20~25% of a volume of the polysilicon is decreased at the connecting portion due to the formation of the titanium silicide. Therefore, a hollow portion 40 is formed under the contact hole 34 as shown in FIG. 13(b). The hollow portion increases a resistance between the interconnection 38 shown in FIG. 12(b) and the fourth conductive layer 16b. In the case where aspect ratio is smaller than 0.6, a thick barrier metal (Ti) layer 36 is formed at the bottom of the contact hole 34. This problem often occurs when the thick barrier metal (Ti) layer is formed at the bottom of the contact hole 34.

SUMMARY OF THE INVENTION

An object of the present invention is to provide a semiconductor device and the method for manufacturing the same that avoid the above described problem.

A semiconductor device includes a semiconductor substrate, a lower conductive layer formed over the semiconductor substrate, an intermediate insulating layer formed over the lower conductive layer, an upper conductive layer formed over the intermediate insulating layer, and crossing the lower conductive layer and a contact hole formed at a crossing portion of the lower conductive layer and the upper conductive layer, and formed in the intermediate insulating layer, wherein an aspect ratio of the contact hole is greater than 0.6.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in conjunction with the attached drawings, in which:

FIG. 6(a), 6(b) and 6(c) are cross sectional views along line BB in FIG. 2 at different steps of manufacturing a semiconductor device of the first preferred embodiment.

FIG. 7(a), 7(b) and 7(c) are cross sectional views of the peripheral portion of the second preferred embodiment at different steps of manufacturing a semiconductor device of the second preferred embodiment.

DETAILED DESCRIPTION OF THE PREFERRED EMBODIMENT

Figure 1:
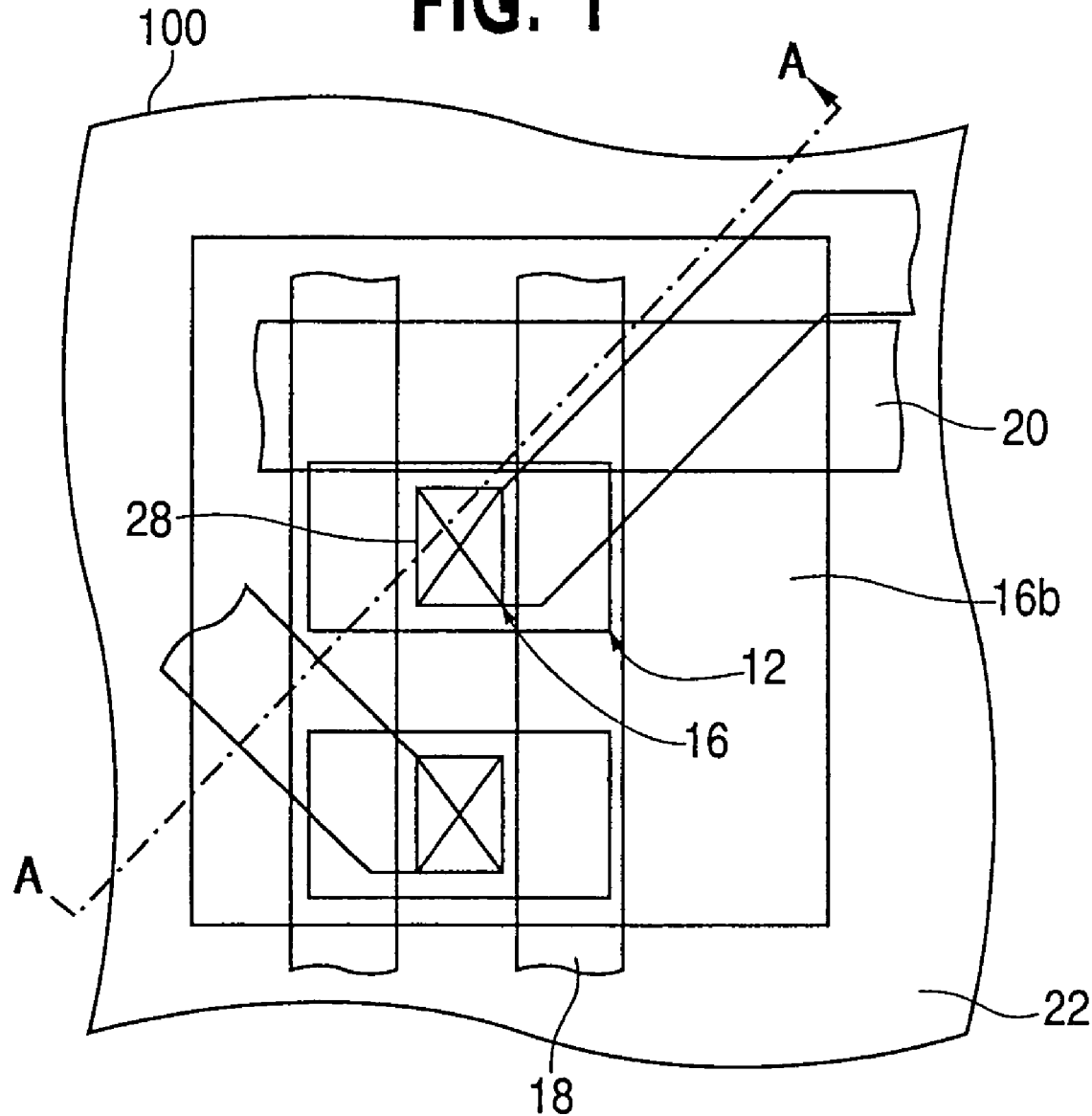
FIG. 1 is a top view of a memory cell of a first preferred embodiment.

The preferred embodiments are described below with reference to the drawings. The same reference numerals are applied to the same elements in each embodiment and drawings.

Figure 2:
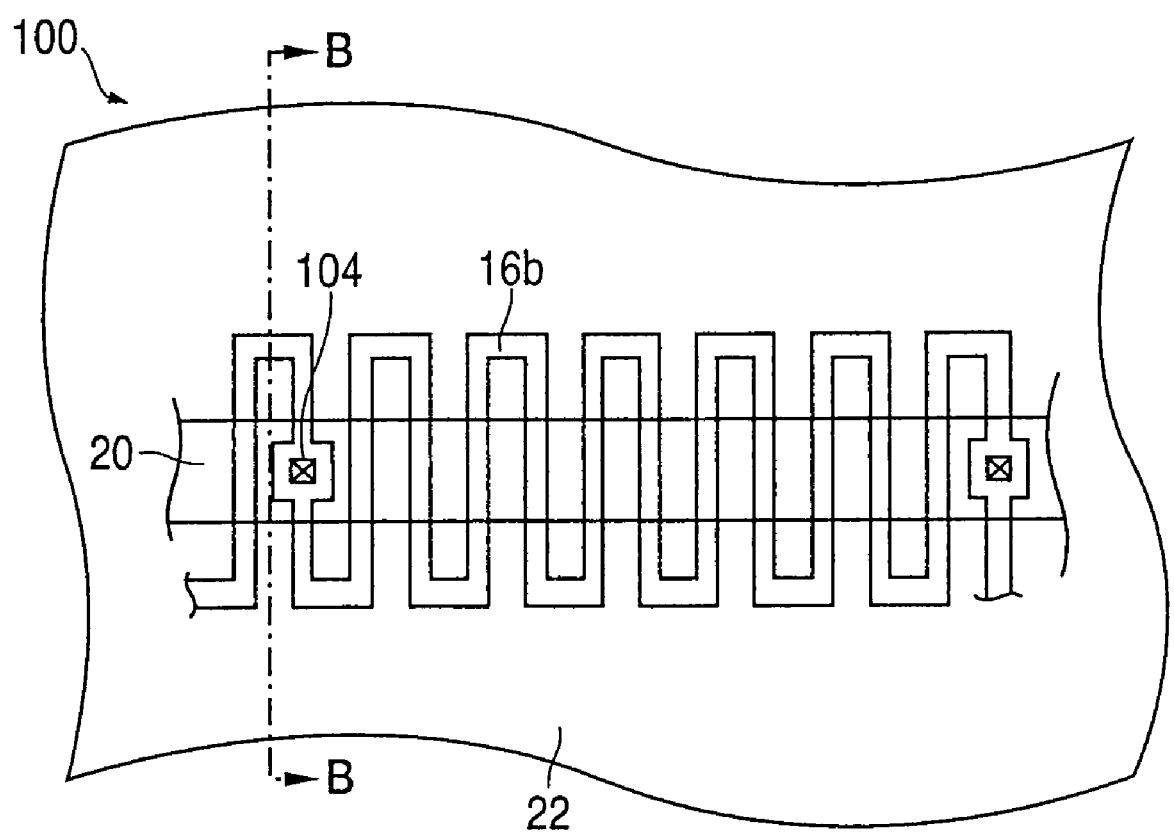
FIG. 2 is a top view of a peripheral circuit of the first preferred embodiment.
Figure 3A:
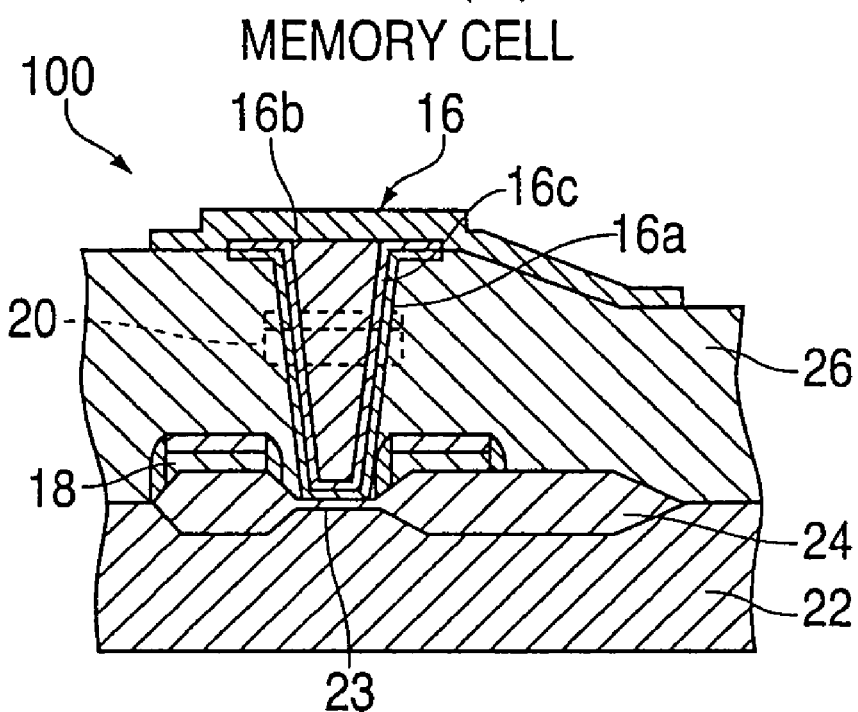
FIG. 3(a), FIG. 4(a) and FIG. 5(a) are cross sectional views along line A-A in FIG. 1, each drawing shows steps of a method for manufacturing a semiconductor device of the first preferred embodiment.
Figure 3B:
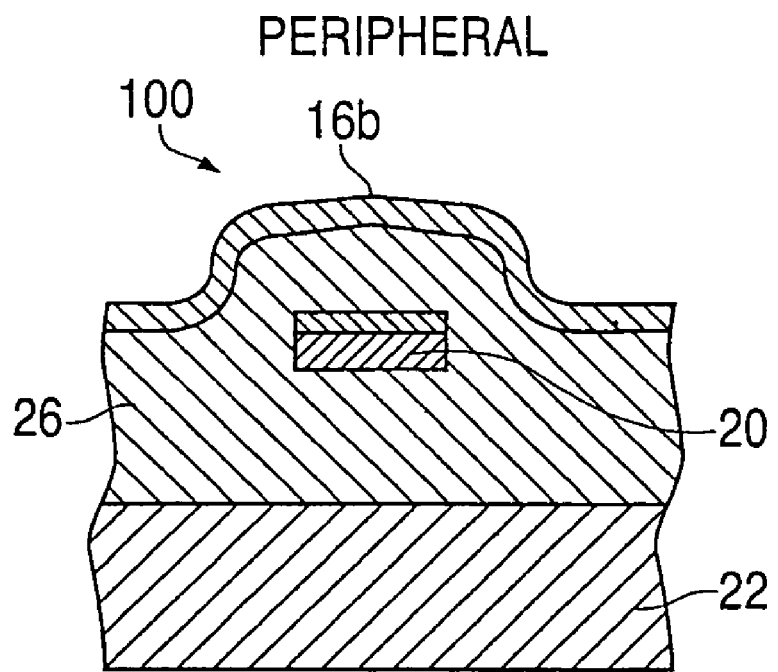
FIG. 3(b), FIG. 4(b) and FIG. 5(b) are cross sectional views along line B-B in FIG. 2 at different steps of manufacturing a semiconductor device of the first preferred embodiment.
Figure 4A:
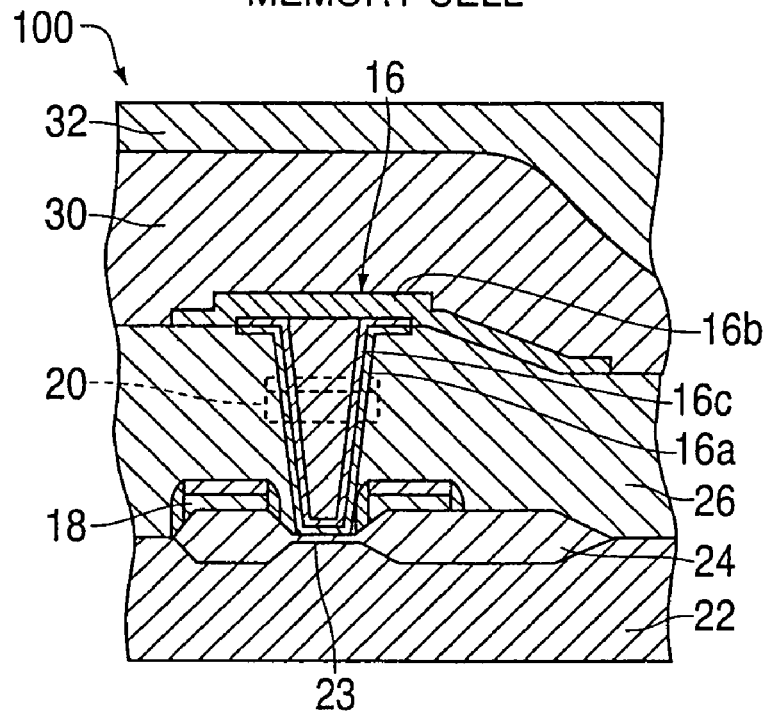
Figure 4B:
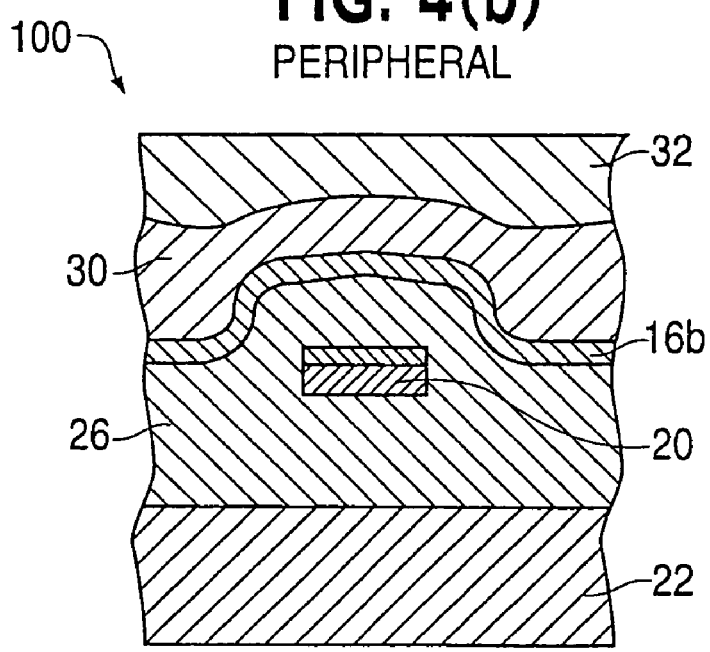
Figure 5A:
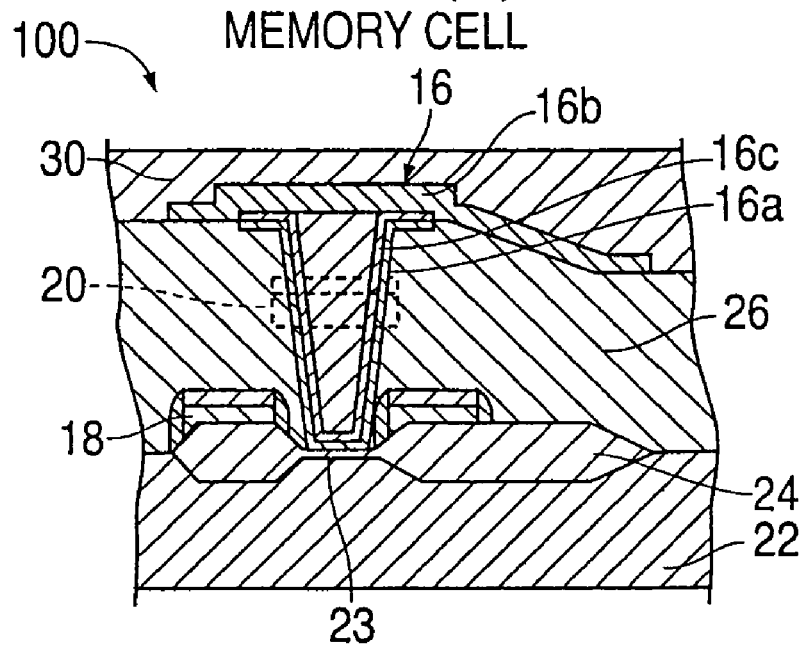
Figure 5B:
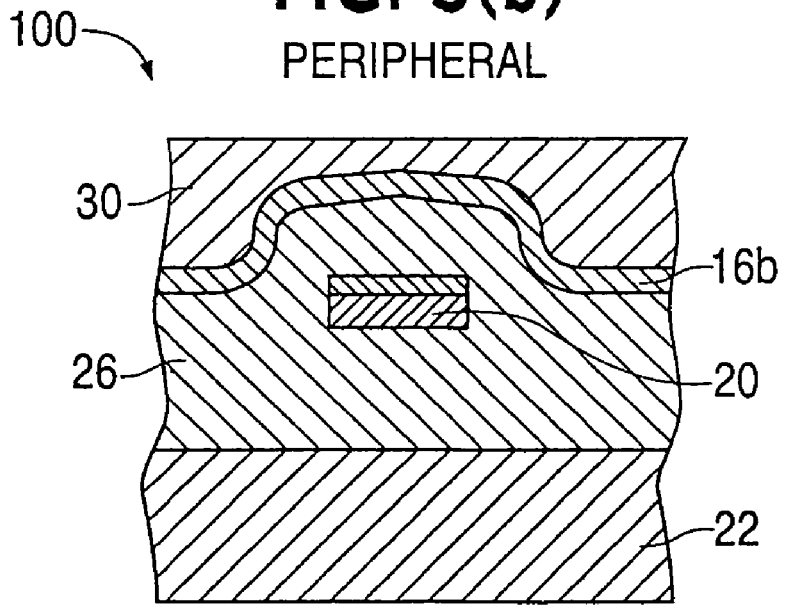

FIG. 1 is a top view of a memory cell of a first preferred embodiment. FIG. 2 is a top view of a peripheral circuit of the first preferred embodiment. FIG. 3(a), FIG. 4(a) and FIG. 5(a) are cross sectional views along line A-A in FIG. 1. FIG. 3(b), FIG. 4(b) and FIG. 5(b) are cross sectional views along line B-B in FIG. 2. FIG. 6(a), 6(b) and 6(c) are also cross sectional views along line B-B in FIG. 2. The semiconductor device of this embodiment has a memory cell array and a peripheral circuit.

In the drawings, elements of the memory cell and the peripheral circuit which are depicted by the same reference numbers are formed in the same process, but are not necessarily connected to each other. For example, reference number 16b of FIG. 4(a) is an electrode and the same reference number 16b of FIG. 4(b) is a resistive element. This components are formed in a same process layer, but are not connected.

A memory cell 12 has a transistor and a capacitor 16 which are formed over a semiconductor substrate 22. A word line for the transistor is made of a first conductive layer 18 in this embodiment. The word line is formed over a gate oxide layer 23 or a field oxide layer 24 as shown in FIG. 3(a). A bit line is a second conductive layer 20 in this embodiment, and it crosses over the first conductive layer 18. A first intermediate insulating layer 26 covers the first conductive layer 18 and the second conductive layer 20.

The capacitor 16 is formed in a trench in the first intermediate insulating layer 26 in this embodiment as shown in FIG. 3(a). The capacitor 16 has a lower electrode 16a (a storage node), an upper electrode 16b (a plate node), and a capacitor insulating layer 16c. The lower electrode is made of polysilicon. The upper electrode 16b is formed in a fourth conductive layer of the device. The fourth conductive layer is a polysilicon layer in this embodiment. The capacitor insulating layer 16c is preferably made of silicon nitride (SiN or Si3N4). A second intermediate insulating layer 30 is formed over the first intermediate insulating layer 26 preferably using a CVD method. The second intermediate insulating layer 30 is made of Boron-Phospho Silicate Glass (BPSG) in this embodiment. The second insulating layer 30 preferably has a thickness of about 1200 nm-1800 nm. After the reflow of the second intermediate insulating layer 30, the Spin On Glass (SOG) layer 32 is formed over the second insulating layer 32 in this embodiment as shown in FIG. 4(a). The SOG layer 32 has a thickness of about 400 nm-500 nm. Then, the SOG layer 32 and the second intermediate insulating layer 30 are etched, and the SOG layer 32 is removed during the etching. The top surface of the second intermediate insulating layer 30 is flattened as a result of the etching, as shown in FIG. 5(a).

The peripheral circuit includes the second conductive layer 20, the first intermediate insulating layer 26, a resistive element 16b formed in the fourth conductive layer, the second intermediate insulating layer 30 and a third intermediate insulating layer 102 and the interconnection 38 as shown in FIG. 6(c).

The second conductive layer 20 is used as an interconnecting layer for the peripheral circuit. The fourth conductive layer 16b is used as a resistance of the peripheral circuit. The resistance 16b is formed on the first intermediate insulating layer 26. The fourth conductive layer 16b is preferably patterned using a lithography and an etching techniques. The fourth conductive layer 16b crosses over the second conductive layer 20 as shown in FIG. 2. The interconnection 38 has a barrier layer and a interconnection layer.

The second intermediate insulating layer 30 and the SOG layer 32 are also formed over the first intermediate insulating layer 26 in the peripheral circuit as shown in FIG. 4(b). The SOG layer 32 and the second intermediate insulating layer 30 are etched, and the SOG layer 32 is removed by the etching. The top surface of the second intermediate insulating layer 30 is then flattened as shown in FIG. 5(b).

Each corresponding layer between the peripheral circuit and the memory cell is formed by the same steps. The second conductive layer 20 of the peripheral circuit is not used as a bit line. FIG. 6(a), (b) and (c) show steps after the flattening of the second intermediate insulating layer 30. The cross sectional view at the peripheral circuit are shown in FIG. 6(a), (b) and (c).

A third intermediate insulating layer 102 is formed over the second intermediate insulating layer 30 as shown in FIG. 6(a). The third intermediate insulating layer 102 is made of BPSG in this embodiment. A thickness of the third intermediate insulating layer 102 is determined according to a depth of a contact hole 104, which is formed over the fourth conductive layer 16b. In other words, the thickness of the third intermediate insulating layer 102 depends on a thickness of the second intermediate insulating layer 30, which remains over the fourth conductive layer 16b. If an aspect ratio of the contact hole 104 is smaller than 0.6, a hollow portion is formed under the contact hole 104 after the Rapid Thermal Nitridation (RTN) because of the formation of the titanium silicate as described above. For example, in case that the diameter of the contact hole 104 is 0.6 μm, the depth of the contact hole 104 has to be greater than 0.36 μm. In case that the thickness of the second intermediate insulating layer 30 over the fourth conductive layer 16b is 0.1 μm, the thickness of the third intermediate insulating layer 102 is greater than 0.26 μm in this embodiment.

The third intermediate insulating layer 102 is etched using a photoresist as a mask, and is removed except for the portion where the contact hole 104 will be formed as shown in FIG. 6(c). The contact hole 104 is formed in the second and third intermediate insulating layer as shown in FIG. 6(c). The contact hole is formed over a crossing portion of the second conductive layer 20 and the fourth conductive layer 16b and formed at a crossing portion of the fourth conductive layer and the interconnection 38. The aspect ratio of the contact hole 104 is greater than 0.6 because of the third intermediate insulating layer 102, and the contact hole 104 preferably has a depth over 0.36 μm. A metal layer (it is preferably Ti layer) is formed in the contact hole 104 and on the third intermediate insulating layer 102 preferably using a CVD method. The metal layer (Ti layer) has a thickness of about 60 nm-120 nm. A RTN is performed to make a metal nitride layer (TiN layer). An interconnect layer (tungsten, W layer) is formed in the contact hole 104, and patterned using lithography and etching techniques. An interconnection 38 is formed in these steps.

There is the third intermediate insulating layer 102 at the contact hole 104 in this embodiment. Therefore, the contact hole 104 has an sufficient depth. A thick metal layer (Ti layer) is not formed at the bottom of the contact hole 104, and the hollow portion is not formed under the contact hole 104. Therefore, the resistance between the fourth conductive layer 16b and the interconnection 38 is not increased.

FIG. 7 shows a second preferred embodiment of the invention. FIG. 7(a), FIG. 7(b) and FIG. 7(c) are cross sectional views along line B-B in FIG. 2.

The steps and the structure before the formation of the SOG layer 32 are the same as the first preferred embodiment. The etching is started after the formation of the SOG layer 32. The etching is then interrupted at a certain timing in this embodiment. For example, the certain timing is when the thickness of the second intermediate insulating layer 202 at the portion, where the contact hole 206 is to be formed, becomes 360 nm. The thickness of the second intermediate insulating layer, which makes the aspect ratio of the contact hole 206 be greater than 0.6, is needed at this time. Then, a photoresist 204 is formed over the second intermediate insulating layer 202 over the fourth conductive layer 16b. The photoresist 204 is formed at least at a portion where the contact hole 104 is formed as shown in FIG. 7(a). The etching is restarted using the photoresist 204 as a mask. The top surface of the second intermediate insulating layer 202 is then flattened except for the portion, over which the photoresist is formed. The photoresist 204 is removed as shown in FIG. 7(b). The convex portion 202a is formed over the second intermediate insulating layer because of the photoresist 204. The contact hole 206 is formed in the convex portion 202a as shown in FIG. 7(c). The contact hole is formed over a crossing portion of the second conductive layer 20 and the fourth conductive layer 16b and formed at a crossing portion of the fourth conductive layer and the interconnection 38. Subsequent steps are preferably the same as the first preferred embodiment.

The convex portion 202a is formed over the insulating layer 202 and the fourth conductive layer 16b in this embodiment. As a result, the contact hole 206 has sufficient depth to maintain a desired aspect ratio, and the hollow portion is not formed under the contact hole 206. The process to form a third intermediate insulating layer is reduced in this embodiment. Therefore, cost and period for manufacturing the semiconductor device are reduced.

Figure 8A:
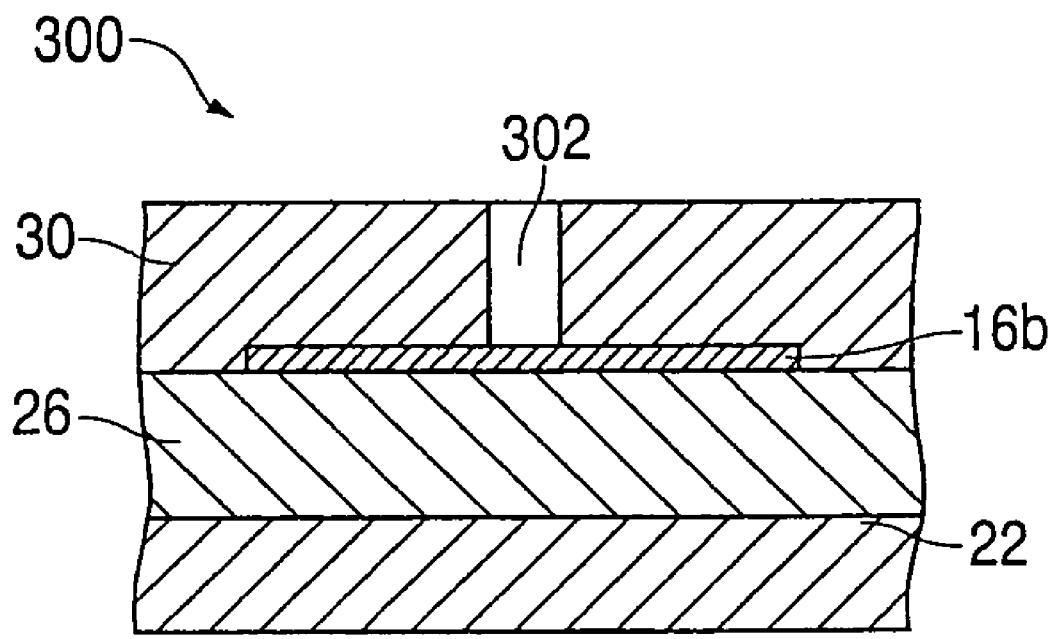
FIGS. 8(a) and 8(b) are cross sectional views of the peripheral portion of the third preferred embodiment, at different steps of manufacturing a semiconductor device of the third preferred embodiment.
Figure 8B:
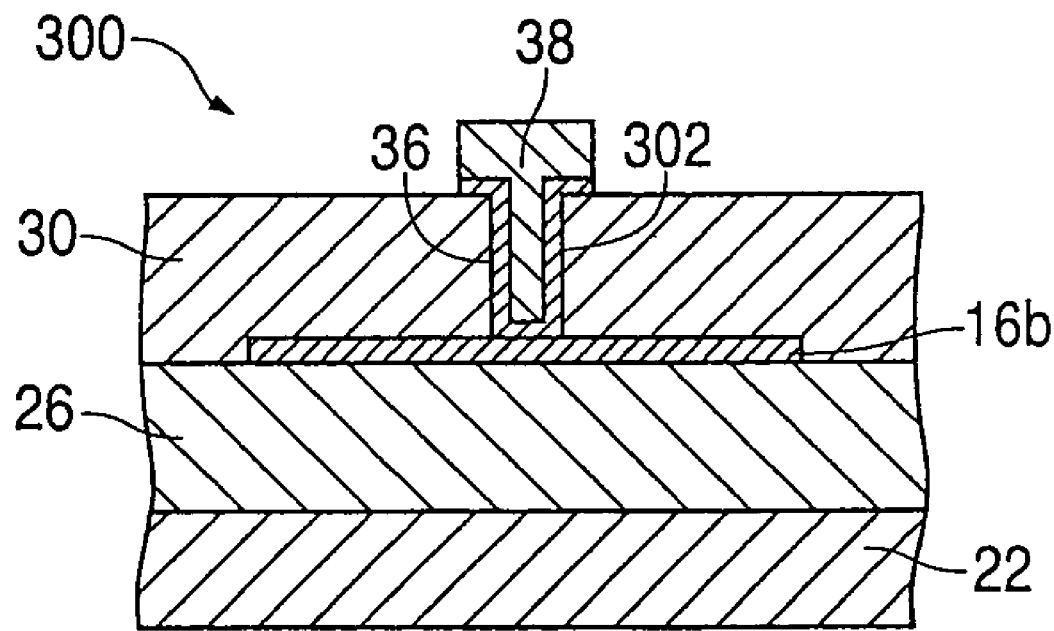

FIG. 8 shows a third preferred embodiment of the invention. FIG. 8(a) and FIG. 8(b) are cross sectional views of the peripheral circuit.

The peripheral circuit of this embodiment does not have the second conductive layer 20 under the fourth conductive layer 16b, as shown in FIG. 8(a). That is to say, the resistance of the peripheral circuit is arranged not to overlap with the second conductive layer 20. Therefore, the second intermediate insulating layer 30 has sufficient thickness for the contact hole 302 to have an aspect ratio which is greater than 0.6. The contact hole 302 is formed after the flattening of the second intermediate insulating layer 30. The contact hole is formed over a crossing portion of the fourth conductive layer and the interconnection 38. The contact hole 302 has an aspect ratio which is greater than 0.6 as described above. Subsequent steps are preferably the same as the other embodiment as shown in FIG. 8(b).

This embodiment eliminates the need for special steps shown in previous embodiments. For example, there is no need for the formation of the third intermediate insulating layer or the formation of the photoresist in this embodiment. Therefore, the process for manufacturing the semiconductor device is simplified, and the top surface of the second intermediate insulating layer is flatter than that of the other embodiments.

Figure 9A:
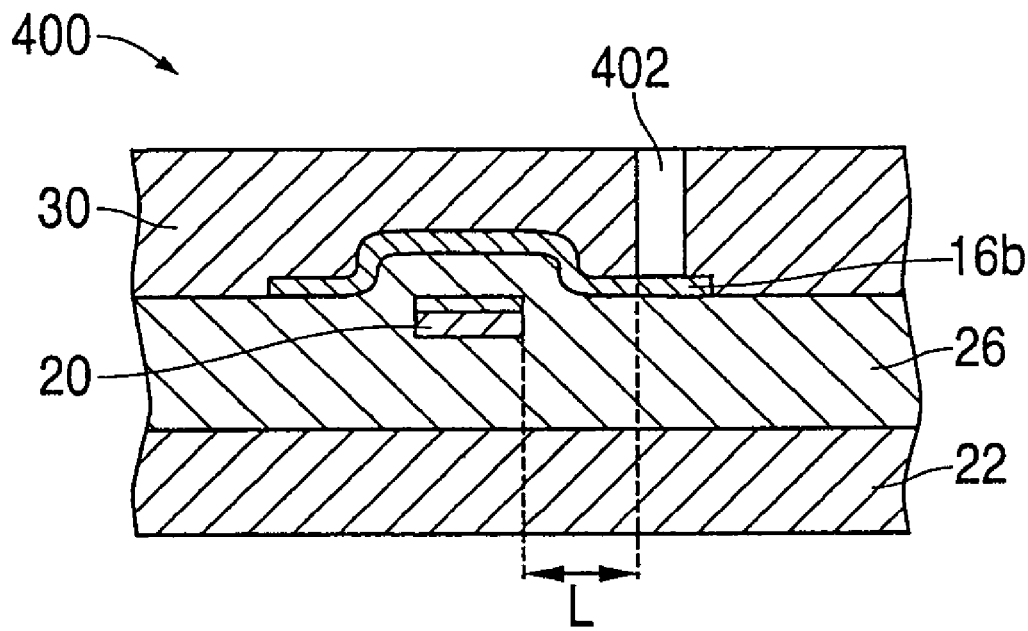
FIGS. 9(a) and 9(b) are cross sectional views of the peripheral portion of the fourth preferred embodiment at different steps of manufacturing a semiconductor device of the fourth preferred embodiment.
Figure 9B:
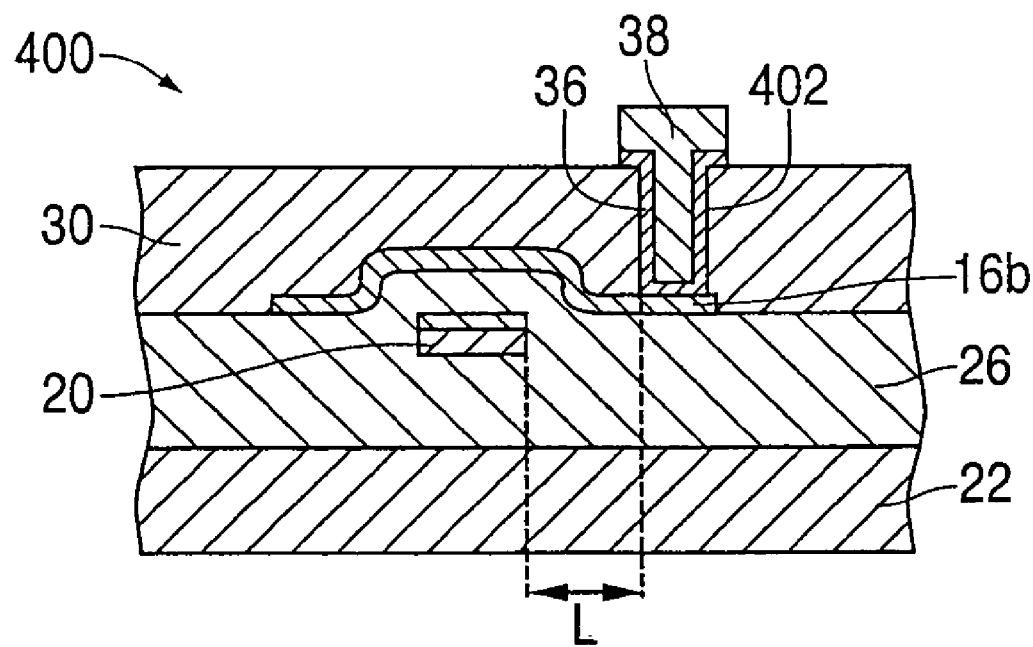
Figure 10A:
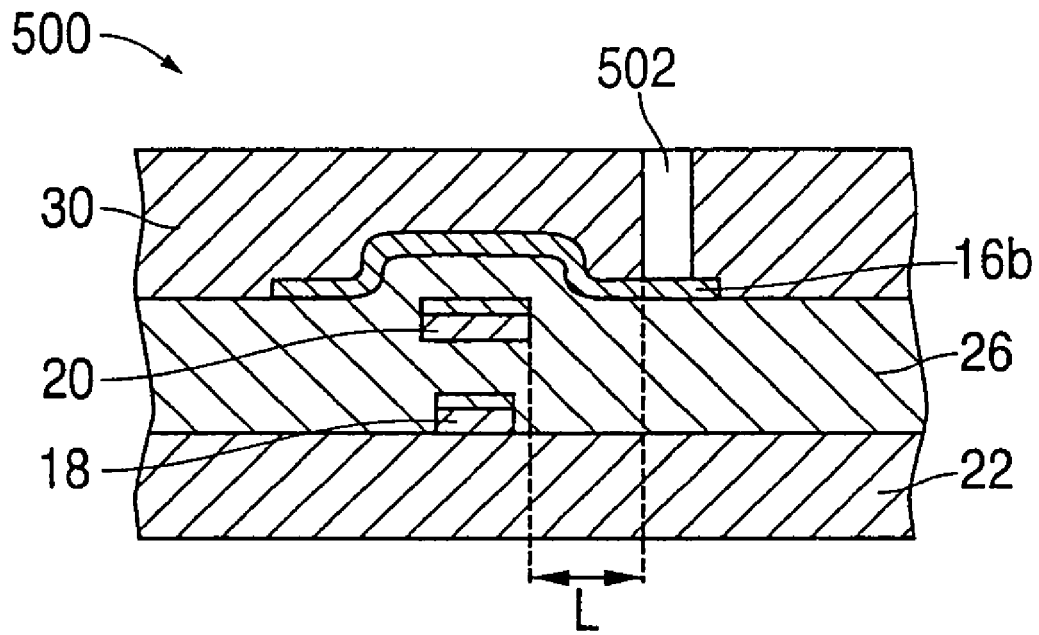
FIGS. 10(a) and 10(b) are cross sectional views of the peripheral portion of the fifth preferred embodiment at different steps of manufacturing a semiconductor device of the fifth preferred embodiment.
Figure 10B:
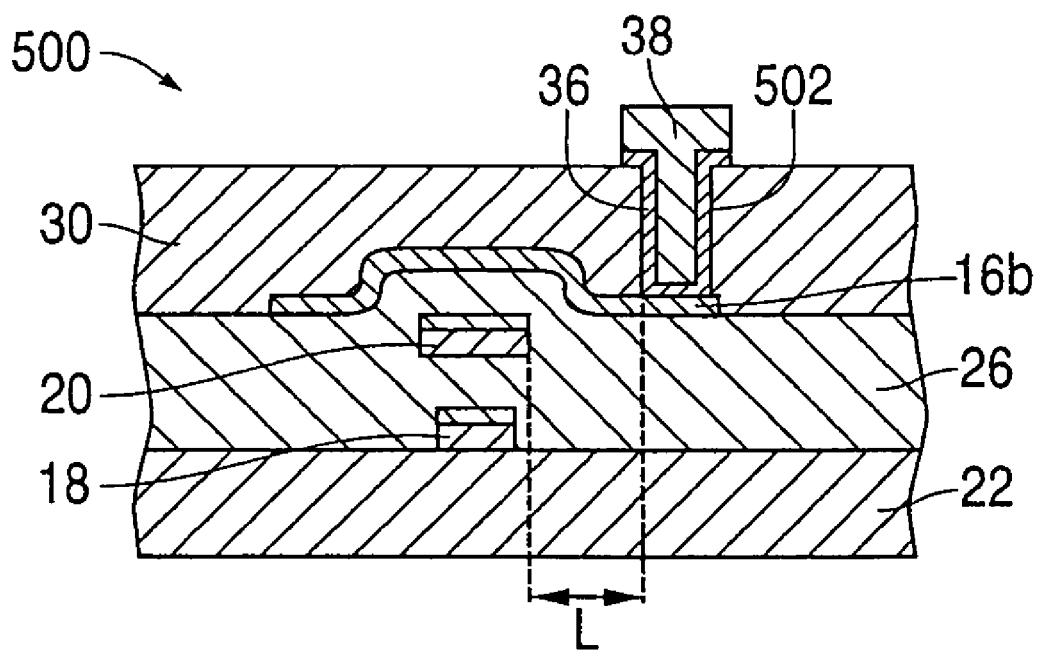

FIG. 9 shows a fourth preferred embodiment of the invention. FIG. 9(a) and FIG. 9(b) are cross sectional views of the peripheral circuit.

The peripheral circuit of this embodiment includes a second conductive layer 20 under the fourth conductive layer 16b as in the first and second preferred embodiments. Therefore, the thickness of the second intermediate insulating layer 30 over the second conductive layer 20 is not sufficient for a contact hole to maintain an aspect ratio. The contact hole 402 of this embodiment is located at least L=1.5 μm away from the portion where the second conductive layer 20 is formed, as shown in FIG. 9(a). The portion to form the contact hole 402 is arranged to make the contact hole 402 have an enough depth to maintain the aspect ratio. The portion has a distance of at least 1.5 μm from the portion where the second conductive layer 20 is formed as described above. The contact hole is not formed over a crossing portion of the second conductive layer 20 and the fourth conductive layer 16b and is formed at a crossing portion of the fourth conductive layer and the interconnection 38. The subsequent steps are the same as the other embodiments as shown in FIG. 9(b).

This embodiment eliminates the need for the special steps shown in previous embodiments. For example, there is no need to form the third intermediate insulating layer or the formation of the photoresist in this embodiment. Therefore, the manufacturing of the semiconductor device is simplified, and the flatness of top surface of the second intermediate insulating layer is improved over that of the other embodiments.

FIGS. 10(a) and 10(b) and FIGS. 11(a) and 11(b) respectively show fifth and sixth embodiments. The fifth embodiment of FIGS. 10(a) and 10(b) has the first conductive layer 18 located under the second semiconductor layer 20. The contact hole 502 is formed at the portion, which is located at least L=1.5 μm from the portion where the second conductive layer and the first conductive layer are formed, as shown.

Figure 11A:
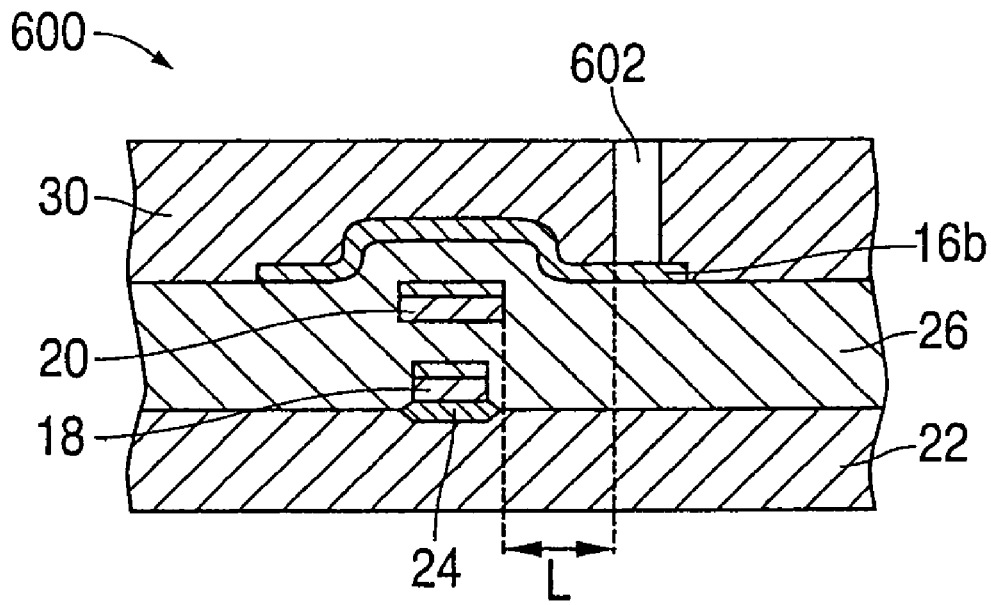
FIGS. 11(a) and 11(b) are cross sectional views of the peripheral portion of the sixth preferred embodiment at different steps of manufacturing a semiconductor device of the sixth preferred embodiment.
Figure 11B:
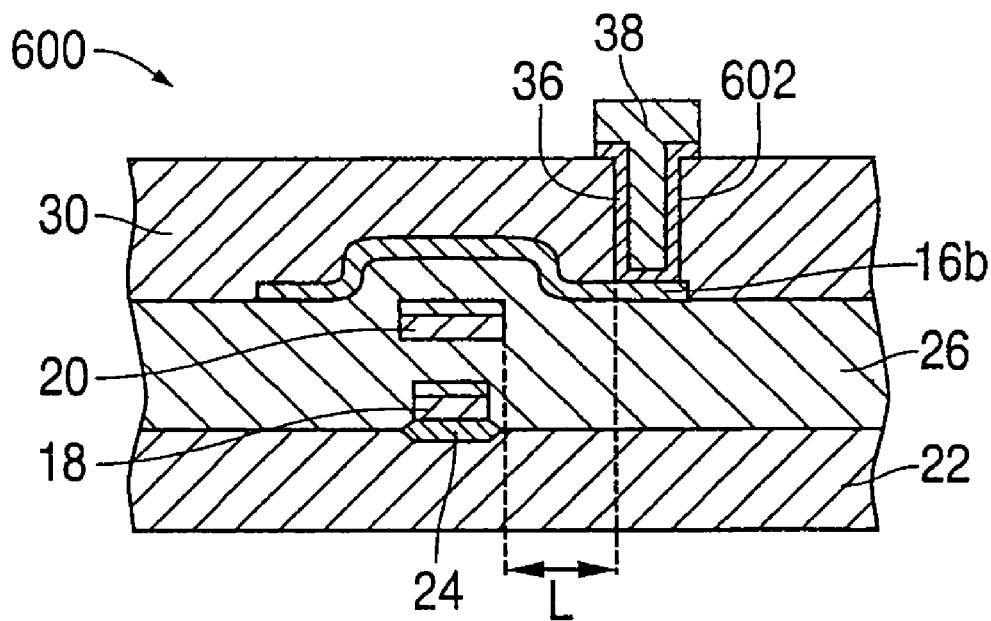
Figure 12A:
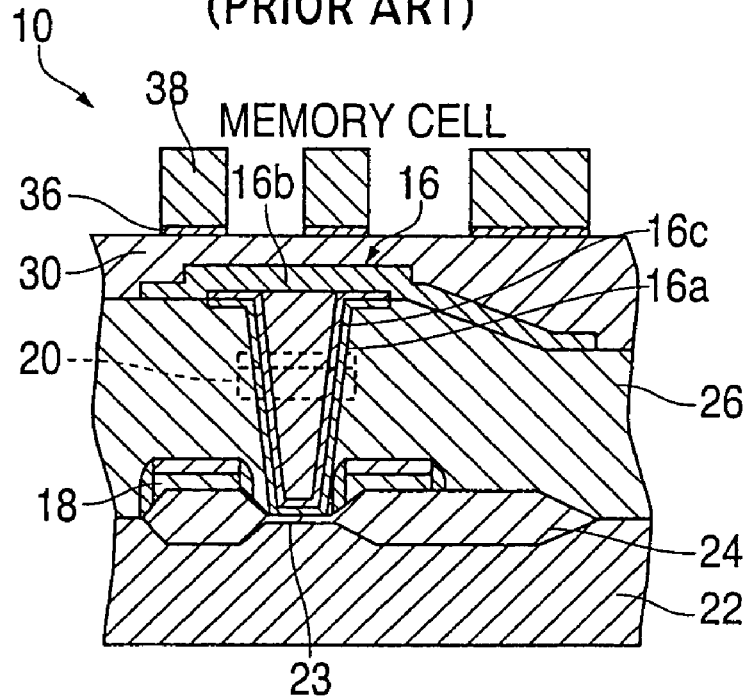
FIGS. 12(a) and 12(b) are cross sectional views of a conventional semiconductor device.
Figure 12B:
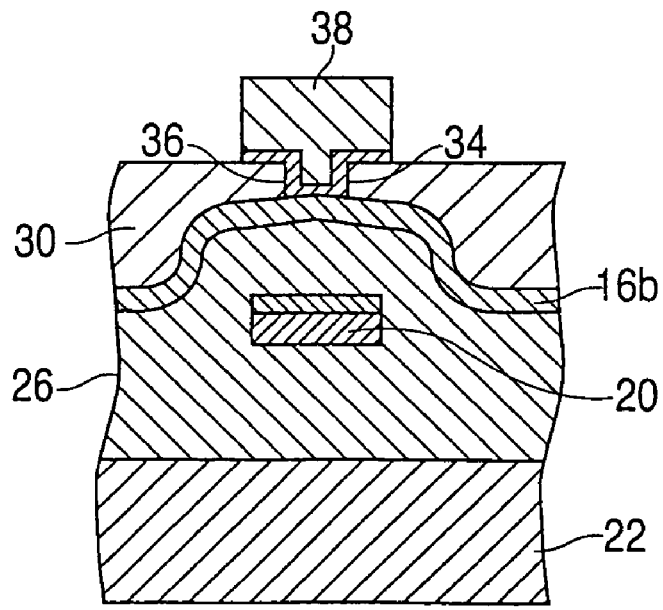
Figure 13A:
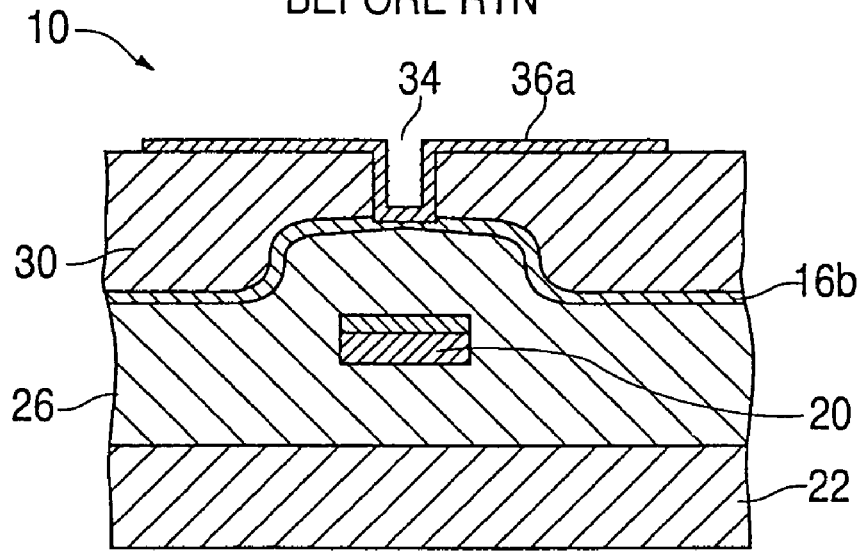
FIGS. 13(a) and 13(b) are schematic diagrams for explaining a drawback of the conventional semiconductor device.
Figure 13B:
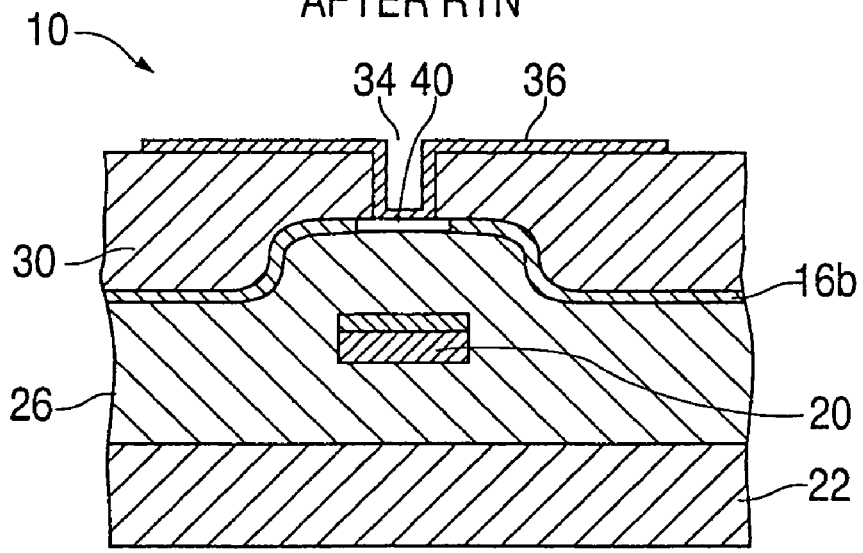

The sixth embodiment of FIGS. 11(a) and 11(b) has the field insulating layer 24 under the second semiconductor layer 20. The contact hole 602 is formed at the portion, which is located at least L=1.5 μm from the portion where the second conductive layer and the field isolating layer are formed, as shown.

The fourth conductive layer is described as the lower conductive layer in claims, the interconnection is described as the upper conductive layer in claims.

One skilled in the art will appreciate that the present invention can be practiced by other than the described embodiments, which are presented for purposes of illustration and not limitation, and the present invention is limited only by the claims that follow.

What is claimed is:

1. A method for manufacturing a semiconductor device comprising:
   forming a lower conductive layer over a semiconductor substrate;
   forming a first intermediate insulating layer, wherein a first portion of the first intermediate insulating layer is directly over the lower conductive layer and a second portion of the first intermediate insulating layer is not over the lower conductive layer, wherein an upper surface of the first portion projects upwardly above an upper surface of the second portion of the first intermediate insulating layer;

forming an upper conductive layer over the first and second portions of the first intermediate insulating layer so that the upper conductive layer crosses over the lower conductive layer, the upper conductive layer having a first section that is directly over the first portion and a second section that is directly over the second portion, an upper surface of the first section projects upwardly above an upper surface of the second section;

forming a second intermediate insulating layer over the upper conductive layer;

etching the second intermediate insulating layer to form a projecting portion of the second intermediate insulating layer that covers at least the first section of the upper conductive layer; and forming a contact hole through the projecting portion of the second intermediate insulating layer at a crossing portion of the lower conductive layer and the upper conductive layer directly over the first portion of the first intermediate insulating layer, wherein an aspect ratio of the contact hole is greater than 0.6.

2. A method for manufacturing a semiconductor device comprising:

forming a lower conductive layer over a semiconductor substrate;

forming a first intermediate insulating layer, wherein a first portion of the first intermediate insulating layer is directly over the lower conductive layer and a second portion of the first intermediate insulating layer is not over the lower conductive layer, wherein an upper surface of the first portion projects upwardly above an upper surface of the second portion of the first intermediate insulating layer;

forming an upper conductive layer over the first and second portions of the first intermediate insulating layer so that the upper conductive layer crosses over the lower conductive layer, the upper conductive layer having a first section that is directly over the first portion and a second section that is directly over the second portion, an upper surface of the first section projects upwardly above an upper surface of the second section;

forming a second intermediate insulating layer over the upper conductive layer;

forming a third intermediate insulating layer on the second intermediate insulating layer;

etching the third intermediate insulating layer to remove portions of the third intermediate insulating layer so that a projecting portion of the third intermediate insulating layer remains to cover at least the first section of the upper conductive layer; and forming a contact hole through the second intermediate insulating layer and the projecting portion of the third intermediate insulating layer at a crossing portion of the lower conductive layer and the upper conductive layer directly over the first portion of the first intermediate insulating layer, wherein an aspect ratio of the contact hole is greater than 0.6.

3. A method for manufacturing a semiconductor device comprising:

forming a first conductive layer over a semiconductor substrate;

forming a first intermediate insulating layer, wherein a first portion of the first intermediate insulating layer is directly over the first conductive layer and a second portion of the first intermediate insulating layer is not over the first conductive layer, wherein an upper surface of the first portion projects upwardly above an upper surface of the second portion of the first intermediate insulating layer;

forming a lower conductive layer over the first and second portions of the first intermediate insulating layer so that the lower conductive layer crosses over the first conductive layer, the lower conductive layer having a first section that is directly over the first portion and a second section that is directly over the second portion, an upper surface of the first section projects upwardly above an upper surface of the second section;

forming a second intermediate insulating layer over the lower conductive layer;

forming a third intermediate insulating layer on the second intermediate insulating layer;

etching the third intermediate insulating layer to remove portions of the third intermediate insulating layer and so that a projecting portion of the third intermediate insulating aver remains to cover at least the first section of the upper conductive layer;

forming a contact hole through the second intermediate insulating layer and the projecting portion of the third intermediate insulating layer at a crossing portion of the lower conductive layer and the first conductive layer directly over the first portion of the first intermediate insulating layer, wherein an aspect ratio of the contact hole is greater than 0.6; and forming an upper conductive layer over the third intermediate insulating layer and in contact with the lower conductive layer through the contact hole.

4. A method for manufacturing a semiconductor device comprising:

forming a first conductive layer over a semiconductor substrate;

forming a first intermediate insulating layer over the first conductive layer and the semiconductor substrate, wherein the first intermediate insulating layer has a convex portion directly over the first conductive layer and another portion directly over the semiconductor substrate, wherein an upper surface of the convex portion is above an upper surface of the another portion;

forming a lower conductive layer over the first and another portions of the first intermediate insulating layer, the lower conductive layer having a first section that is directly over the convex portion and a second section that is directly aver the another portion, an upper surface of the first section projects upwardly above an upper surface of the second section;

forming a second intermediate insulating layer over the lower conductive layer;

etching the second intermediate insulating layer to form a projecting portion of the second intermediate insulating layer that covers at least the first section of the lower conductive layer;

forming a contact hole through the projecting portion of the second intermediate insulating layer at a crossing portion of the lower conductive layer and the first conductive layer directly over the convex portion of the first intermediate insulating layer, wherein an aspect ratio of the contact hole is greater than 0.6; and forming an upper conductive layer over the second intermediate insulating layer and in contact with the lower conductive layer through the contact hole.

* * * * *